(12) United States Patent
Strickland

(10) Patent No.: US 7,383,373 B1
(45) Date of Patent: Jun. 3, 2008

(54) DERIVING CORRESPONDING SIGNALS

(75) Inventor: Stephen E. Strickland, Marlborough, MA (US)

(73) Assignee: EMC Corporation, Hopkinton, MA (US)

( * ) Notice: Subject to any disclaimer, the term of this patent is extended or adjusted under 35 U.S.C. 154(b) by 91 days.

(21) Appl. No.: 11/386,029

(22) Filed: Mar. 21, 2006

(51) Int. Cl.
| | |
|---|---|
| G06F 13/00 | (2006.01) |
| G06F 13/36 | (2006.01) |
| G06F 1/04 | (2006.01) |
| H05K 7/10 | (2006.01) |
| H03K 17/16 | (2006.01) |
| H03K 19/003 | (2006.01) |
| H03K 19/094 | (2006.01) |
| H03B 1/00 | (2006.01) |
| H03F 3/45 | (2006.01) |
| G01R 31/08 | (2006.01) |

(52) U.S. Cl. .......... 710/315; 710/301; 326/30; 326/86; 327/108; 327/291; 327/295; 330/253; 370/235; 370/242

(58) Field of Classification Search .......... 710/301, 710/315; 326/30, 86; 327/108, 291, 295; 330/253; 370/235, 242
See application file for complete search history.

(56) References Cited

U.S. PATENT DOCUMENTS

| | | | | |
|---|---|---|---|---|
| 5,754,796 | A * | 5/1998 | Wang et al. ............ | 710/301 |
| 5,850,157 | A * | 12/1998 | Zhu et al. ............ | 327/295 |
| 6,353,352 | B1 * | 3/2002 | Sharpe-Geisler ........ | 327/295 |
| 6,356,114 | B1 * | 3/2002 | Selander ............... | 326/83 |
| 6,418,121 | B1 * | 7/2002 | Flickinger et al. ...... | 370/242 |
| 6,424,217 | B1 * | 7/2002 | Kwong ................ | 330/253 |
| 6,426,646 | B2 * | 7/2002 | Yoshizawa et al. ...... | 326/30 |
| 6,437,599 | B1 * | 8/2002 | Groen ................. | 326/63 |
| 6,483,806 | B1 * | 11/2002 | Flickinger et al. ...... | 370/235 |
| 6,542,031 | B2 * | 4/2003 | Kwong ................ | 330/253 |
| 6,864,707 | B2 * | 3/2005 | Wong et al. ........... | 326/30 |
| 6,897,699 | B1 * | 5/2005 | Nguyen et al. ......... | 327/295 |
| 6,972,607 | B1 * | 12/2005 | Chen et al. ........... | 327/291 |
| 7,113,007 | B2 * | 9/2006 | Kushiyama et al. ..... | 327/108 |
| 7,129,750 | B2 * | 10/2006 | Dubey ................ | 326/66 |
| 7,138,822 | B2 * | 11/2006 | Ritchie et al. ......... | 326/30 |
| 7,205,787 | B1 * | 4/2007 | Massoumi et al. ...... | 326/30 |
| 7,262,641 | B2 * | 8/2007 | King ................. | 327/108 |
| 2006/0132248 | A1 * | 6/2006 | Lichter et al. ........ | 331/107 A |

OTHER PUBLICATIONS

Zarkeshvari, F.; Noel, P.; Kwasrkwski, T., "High-speed serial I/O trends, standards and techniques," Electrical and Electronics Engineering, 2004. (ICEEE). 1st International Conference on, pp. 261-266, Jun. 24-27, 2004.*

Iniewski, K.; Magierowski, S.; Syrzycki, M., "Phase Locked Loop gain shaping for gigahertz operation," Circuits and Systems, 2004. ISCAS '04. Proceedings of the 2004 International Symposium on, vol. 4, No. pp. IV-157-IV-60 vol. 4, May 23-26, 2004.*

* cited by examiner

Primary Examiner—Mark Rinehart
Assistant Examiner—Faisal M Zaman
(74) Attorney, Agent, or Firm—Krishnendu Gupta; Jason A. Reyes

(57) ABSTRACT

Apparatus used in deriving corresponding signals includes first and second circuitry. The first circuitry derives, from a source-terminated first signal driven from a Peripheral Control Interface (PCI) Express compatible source, an AC-coupled second signal. The second circuitry derives, from the AC-coupled second signal, a destination-terminated DC biased third signal that drives a pseudo-emitter-coupled logic (PECL) compatible receiver.

12 Claims, 8 Drawing Sheets

DERIVING CORRESPONDING SIGNALS

FIELD OF THE INVENTION

The present invention relates to deriving corresponding signals.

BACKGROUND OF THE INVENTION

Today's networked computing environments are used in businesses for generating and storing large amounts of critical data. The systems used for moving, storing, and manipulating this critical data are expected to have high performance, high capacity, and high reliability, while being reasonably priced and having reasonable power consumption and electromagnetic interference (EMI) characteristics.

Early low-power circuits employed full-voltage-swing signaling. For example, a complementary metal-oxide-semiconductor (CMOS) output can swing from ground to the power-supply voltage, such as 0-5 or 0-3 volts. However, as signal speeds increase, unwanted EMI is increasingly generated, and signal quality deteriorates due to reflections, ringing, and voltage undershoot.

Reducing the voltage swing reduces these undesirable effects. However, noise margin is also reduced as the voltage swing is cut. Noise margin can be improved by using two signal wires to transmit a logical signal, rather than just one wire. Such differential signaling has been used for many years in bipolar emitter-coupled logic (ECL) systems.

More recently, the benefits of differential ECL signaling and low-power CMOS have been combined in what is known as pseudo-emitter-coupled logic (PECL). PECL uses differential signaling and current-steering through CMOS transistors. Data rates of 1 Gigabit per second and higher are desired.

FIG. 1A shows a differential signaling scheme. Driver 910 drives lines Y1, Y2 with opposite data. Current is steered among lines Y1, Y2 so that the amount of current passing through each of resistors 914 varies with the data. The I*R voltage drop across resistors 914 can be sensed by receiver 912. The other terminal of resistors 914 is connected to terminating voltage VTT.

FIG. 1B highlights the reduced voltage swing of differential signaling. Lines Y1, Y2 are driven to opposite states, depending on the data transmitted. The logic high level is reached when Y1 is driven to a VOH voltage, while the complement line Y2 is driven to a VOL level. For the logic low level, Y1 is driven to the VOL voltage, while the complement line Y2 is driven high to a VOH level.

To minimize EMI radiation and signal distortion, VOH and VOL are chosen to be close to each other. This minimizes the voltage swing from VOL to VOH. For example, VOL can be set to 1.66 volts, while VOH is set to 2.33 volts in systems with 3-volt supplies. The signal swing is thus reduced to about 700 mV. The terminating voltage VTT can be set to 2 volts below Vcc, or about 1.3 volts. This is below both VOH and VOL.

When 50-ohm terminating resistors are used for lines Y1, Y2, the amount of current to produce the desired VOH and VOL levels can be calculated using Ohm's law. The current switched is I=V/R=0.33v/50=6.6 mA.

Electronic signaling within and between integrated circuits (ICs) is accomplished using PECL and many other different formats, standards, and approaches. Each of these electronic signaling types may be based on and/or reflect a voltage range or swings thereof, an absolute current or changes thereto, a signaling speed or frequency modulation, a combination thereof, and so forth. The various circuits that are used to implement such different electronic signaling types are equally diverse, and may include, for example, signal transmitters or receivers.

Another example of such diverse circuit types for implementing the different electronic signaling types is Peripheral Control Interface (PCI) Express circuitry. (PCI Express is described in the PCI-SIG document "PCI Express Base Specification 1.0a" and accompanying documentation.)

The standard bus for computer peripherals has evolved from the early ISA interface, EISA interface, PCI33 interface, to PCI66 interface and PCI133 interface. The PCI associated peripheral devices prevail in recent years.

The PCI Express interface is becoming the standard interface of the next generation. PCI Express applies to point-to-point transmission. For each end point, each PCI Express lane has a signal transmission pair and a signal receiving pair. PCI express data transceiving requires four physical signals, and a plurality of control signals. The PCI Express specification defines the termination state of the receiver and the transmitter, including impedance, and common mode voltage, etc.

PCI Express devices employ differential drivers and receivers at each port. A positive voltage difference between a driver's terminals implies Logical 1. A negative voltage difference between the driver's terminals implies a Logical 0. No voltage difference between the driver's terminals means that the driver is in the high-impedance tristate condition. The PCI Express differential peak-to-peak signal voltage at the transmitter ranges from 800 mV-1200 mV, while the differential peak voltage is one-half these values. The common mode voltage can be any voltage between 0 V and 3.6 V. The differential driver is DC isolated from the differential receiver at the opposite end of the link by placing a capacitor at the driver side of the link. Two devices at opposite ends of a link may support different DC common mode voltages. The differential impedance at the receiver is matched with the board impedance to prevent reflections from occurring.

FIG. 2 illustrates a transmitter 110 that communicates over a PCI-Express link 150 with a receiver 170; link 150 is a differential transmission line. AC coupling between the transmitter 110 and receiver 170 is provided by coupling capacitors 160. As shown in FIG. 2, the transmitter 110 includes a pair of resistors 115, 120 between the differential transmission line 150 and ground. Similarly, the receiver 170 includes a pair of resistors 175, 180 between the differential transmission line 150 and ground. The resistors 115, 120, 175, 180 terminate the differential transmission line 150 to avoid reflections at higher speeds. The resistors 115, 120, 175, 180 typically have resistance values on the order of 50 Ohms.

For PECL signaling on a high-speed serial link for example, a high voltage swing is typically employed. Also, the common mode voltage set is typically far above zero volts. However, for PCI Express signaling, the signal input receiver is specified to have a zero volt termination. In other words, for PCI Express signaling, the signal common mode voltage on the receiving side of coupling capacitors is to be maintained at zero volts.

In at least some applications, PECL technology accepts a 600 mv swing centered around a 2 volt offset, and PCI Express technology accepts 700 mv as Vhigh and 300 mv as Vlow.

SUMMARY OF THE INVENTION

Apparatus used in deriving corresponding signals includes first and second circuitry. The first circuitry derives, from a source-terminated first signal driven from a Peripheral Control Interface (PCI) Express compatible source, an AC-coupled second signal. The second circuitry derives, from the AC-coupled second signal, a destination-terminated DC biased third signal that drives a pseudo-emitter-coupled logic (PECL) compatible receiver.

One or more implementations of the invention may provide one or more of the following advantages.

A system having PCI Express driven components and PECL driven components can drive both kinds of components based on a single oscillator. Cost savings and a reduced failure rate can be achieved by relying on fewer oscillators, since oscillators can be costly and failure prone. PCI Express driven components and PECL driven components can execute synchronously off the same reference clock, which saves clock cycles and improves performance.

Other advantages and features will become apparent from the following description, including the drawings, and from the claims.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

DETAILED DESCRIPTION

Figure 1A:
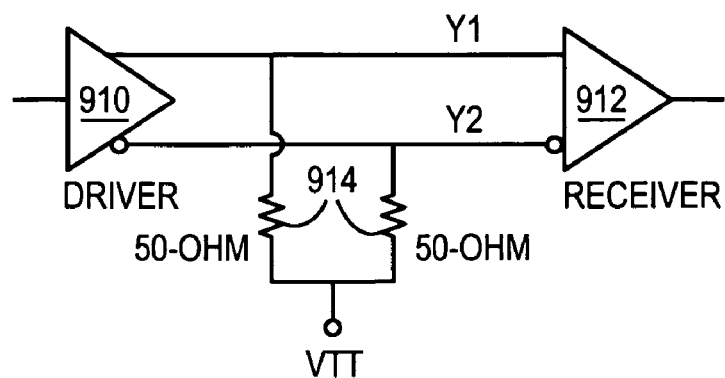
FIGS. 1A-2 are illustrations of prior art circuitry.
Figure 1B:
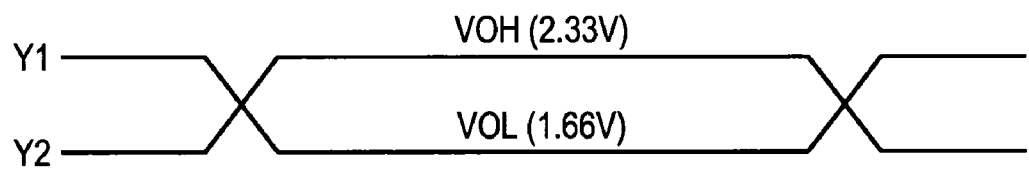
Figure 2:
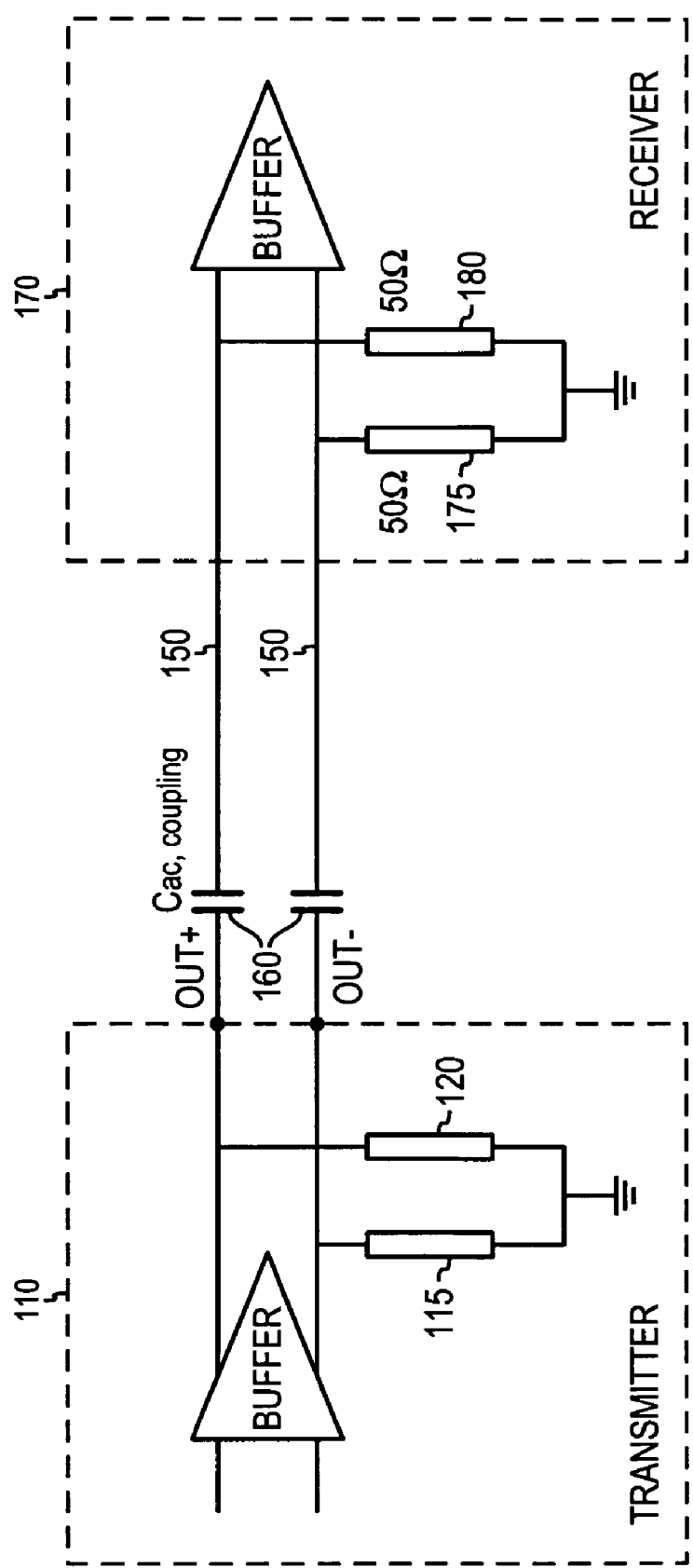
Figure 3:
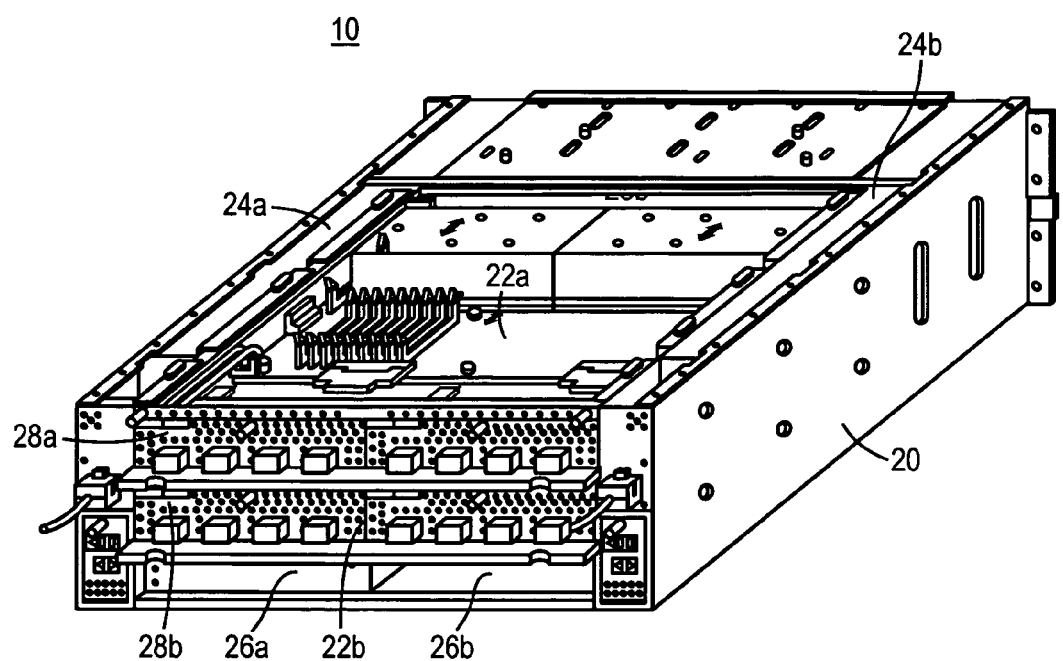
FIG. 3 is an isometric view of a storage system in which the invention may be implemented.

Referring to FIG. 3, there is shown a portion of a storage system 10 that is one of many types of systems in which the principles of the invention may be employed. The storage system 10 shown may operate stand-alone or may populate a rack including other similar systems. The storage system 10 may be one of several types of storage systems. For example, if the storage system 10 is part of a storage area network (SAN), it is coupled to disk drives via a storage channel connection such as Fibre Channel. If the storage system 10 is, rather, a network attached storage system (NAS), it is configured to serve file I/O over a network connection such as an Ethernet.

Figure 4:
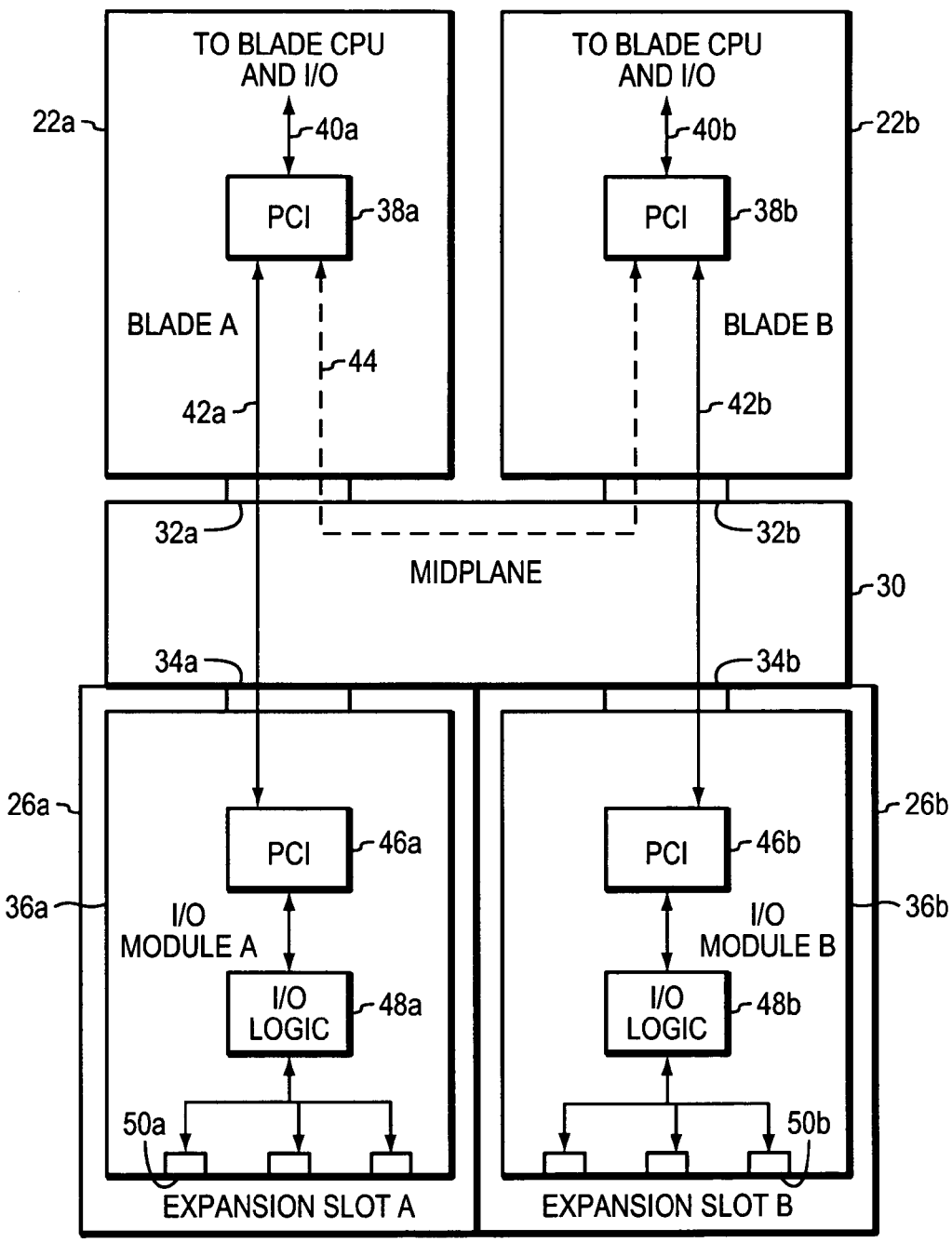
FIG. 4 is a schematic representation of a first configuration of the system of FIG. 3 showing blades, two expansion slots, and two I/O modules installed in the expansion slots.

The storage system 10 includes within a chassis 20 a pair of blades 22a and 22b, dual power supplies 24a,b and dual expansion slots 26a,b. The blades 22a and 22b are positioned in slots 28a and 28b respectively. The blades 22a,b include CPUs, memory, controllers, I/O interfaces and other circuitry specific to the type of system implemented. The blades 22a and 22b are preferably redundant to provide fault tolerance and high availability. The dual expansion slots 26a,b are also shown positioned side by side and below the blades 22a and 22b respectively. The blades 22a,b and expansion slots 26a,b are coupled via a midplane 30 (FIG. 4). In accordance with the principles of the invention, the expansion slots 26a,b can be used in several ways depending on system requirements.

In FIG. 4, the interconnection between modules in the expansion slots 26a,b and the blades 22a,b is shown schematically in accordance with a first configuration. Each blade 22a,b is coupled to the midplane 30 via connectors 32a,b. The expansion slots 26a,b are also shown coupled to the midplane 30 via connectors 34a,b. The blades 22a,b can thus communicate with modules installed in the expansion slots 26a,b across the midplane 30. In this configuration, two I/O modules 36a and 36b are shown installed within the expansion slots 26a and 26b respectively and thus communicate with the blades 22a,b separately via the midplane 30.

In accordance with a preferred embodiment, the blades 22a,b and I/O modules 36a,b communicate via PCI Express buses. Each blade 22a,b includes a PCI Express switch 38a,b that drives a PCI Express bus 40a,b to and from blade CPU and I/O resources. The switches 38a,b split each PCI Express bus 40a,b into two PCI Express buses. One PCI Express bus 42a,b is coupled to the corresponding expansion slot 26a,b. The other PCI Express bus 44 is coupled to the other blade and is not used in this configuration—thus it is shown dotted. The I/O modules 36a,b are PCI Express cards, including PCI Express controllers 46a,b coupled to the respective bus 42a,b. Each I/O module 36a,b includes I/O logic 48a,b coupled to the PCI Express controller 46a,b for interfacing between the PCI Express bus 42a,b and various interfaces 50a,b such as one or more Fibre Channel ports, one or more Ethernet ports, etc. depending on design requirements. Furthermore, by employing a standard bus interface such as PCI Express, off-the-shelf PCI Express cards may be employed as needed to provide I/O functionality with fast time to market.

The configuration of FIG. 4 is particularly useful where the storage system 10 is used as a NAS. The NAS is I/O intensive; thus, the I/O cards provide the blades 22a,b with extra I/O capacity, for example in the form of gigabit Ethernet ports.

Figure 5:
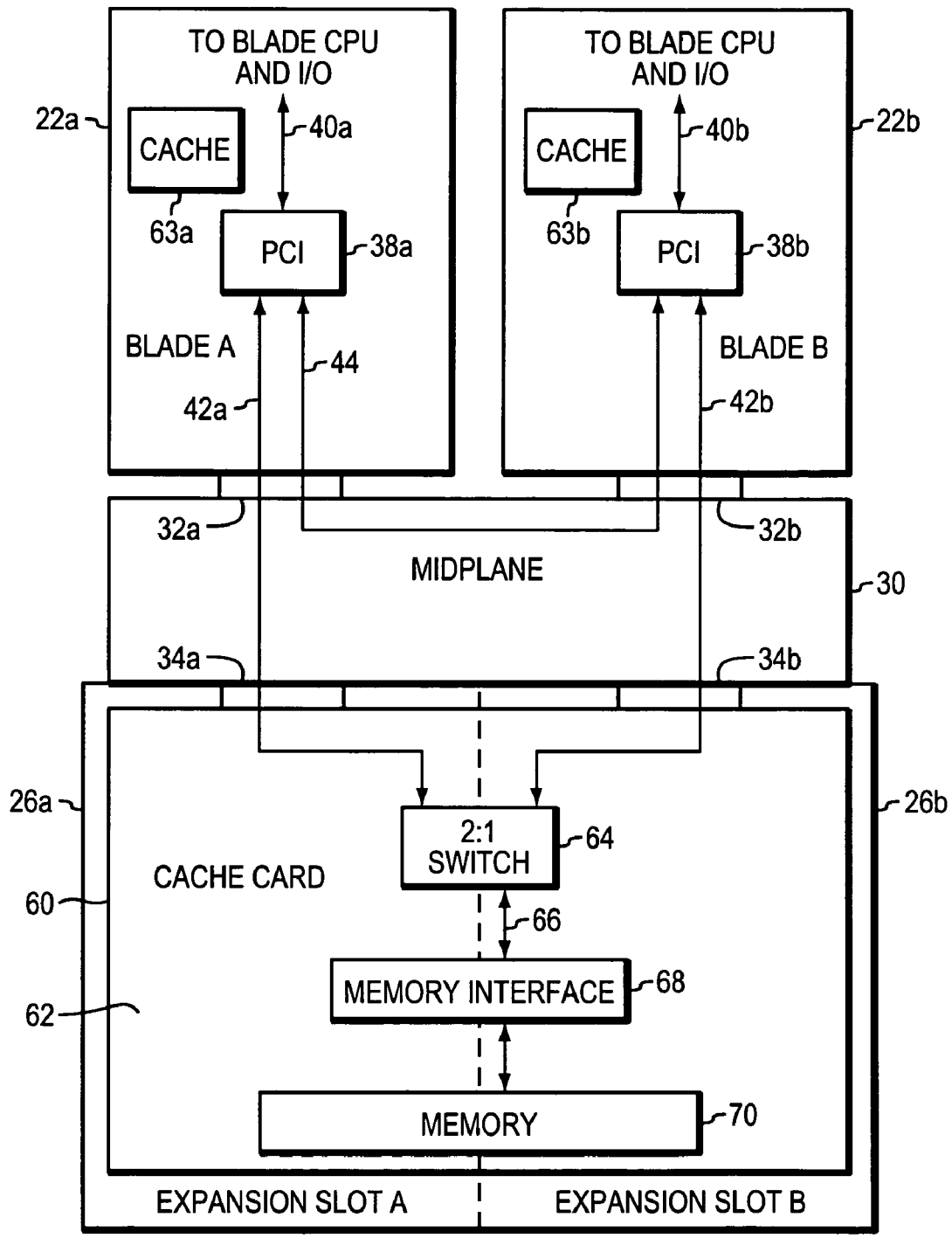
FIG. 5 is a schematic representation of a second configuration of the system of FIG. 3 showing the blades, two expansion slots, and one shared cache memory card installed in both the expansion slots.

Referring to FIG. 5, there is shown an alternate arrangement for use of the expansion slots 26a,b. In this arrangement, a single shared resource 60 is inserted in both the expansion slots 26a,b and is shared by the blades 22a,b. The shared resource 60 may be for example a cache card 62. The cache card 62 is particularly useful for purposes of high availability in a SAN arrangement. In a SAN arrangement using redundant blades 22a,b as shown, each blade includes cache memory 63a,b for caching writes to the disks. During normal operation, each blade's cache is mirrored in the other. The blades 22a,b mirror the data between the caches 63a,b by transferring it over the PCI Express bus 44. If one of the blades, for example blade 22a, fails, the mirrored cache 63a becomes unavailable to the other blade 22b. In this case, the surviving blade 22b can access the cache card 62 via the PCI Express bus 42b for caching writes, at least until the failed blade 22a recovers or is replaced.

As seen in FIG. 5, the cache card 62 includes a two-to-one PCI Express switch 64 coupled to the PCI Express buses 42a,b. The switch 64 gates either of the two buses to a single PCI Express bus 66 coupled to a memory interface 68. The memory interface 68 is coupled to the cache memory 70. Either blade 22a or 22b can thus communicate with the cache memory 70.

Referring to both FIGS. 4 and 5, it is noted that the PCI Express bus 44 is not used in the NAS arrangement but is used in the SAN arrangement. Were the PCI Express switches 38a,b not provided. The PCI Express bus 40a,b would be coupled directly to the PCI Express bus 44 for SAN functionality and thus would not be usable in the NAS arrangement. Through addition of the switches 38a,b, the PCI Express bus 40a,b is useful in the NAS arrangement when the PCI Express bus 44 is not in use, and is useful in the SAN arrangement during a blade failure. Note that the PCI Express bus 44 and the PCI Express buses 42a,b are not used at the same time, so full bus bandwidth is always maintained.

Many components in the system require a PCI Express clock. A single clock derived from a single oscillator may be used together with buffers to generate clocks, including PCI Express clocks, for use in the system. One or more components in the system may require a PECL clock. Conventionally, a separate PECL clock can be generated using another oscillator, and the system may optionally include circuitry to support separate oscillators for PCI Express and PECL clocks.

Figure 6:
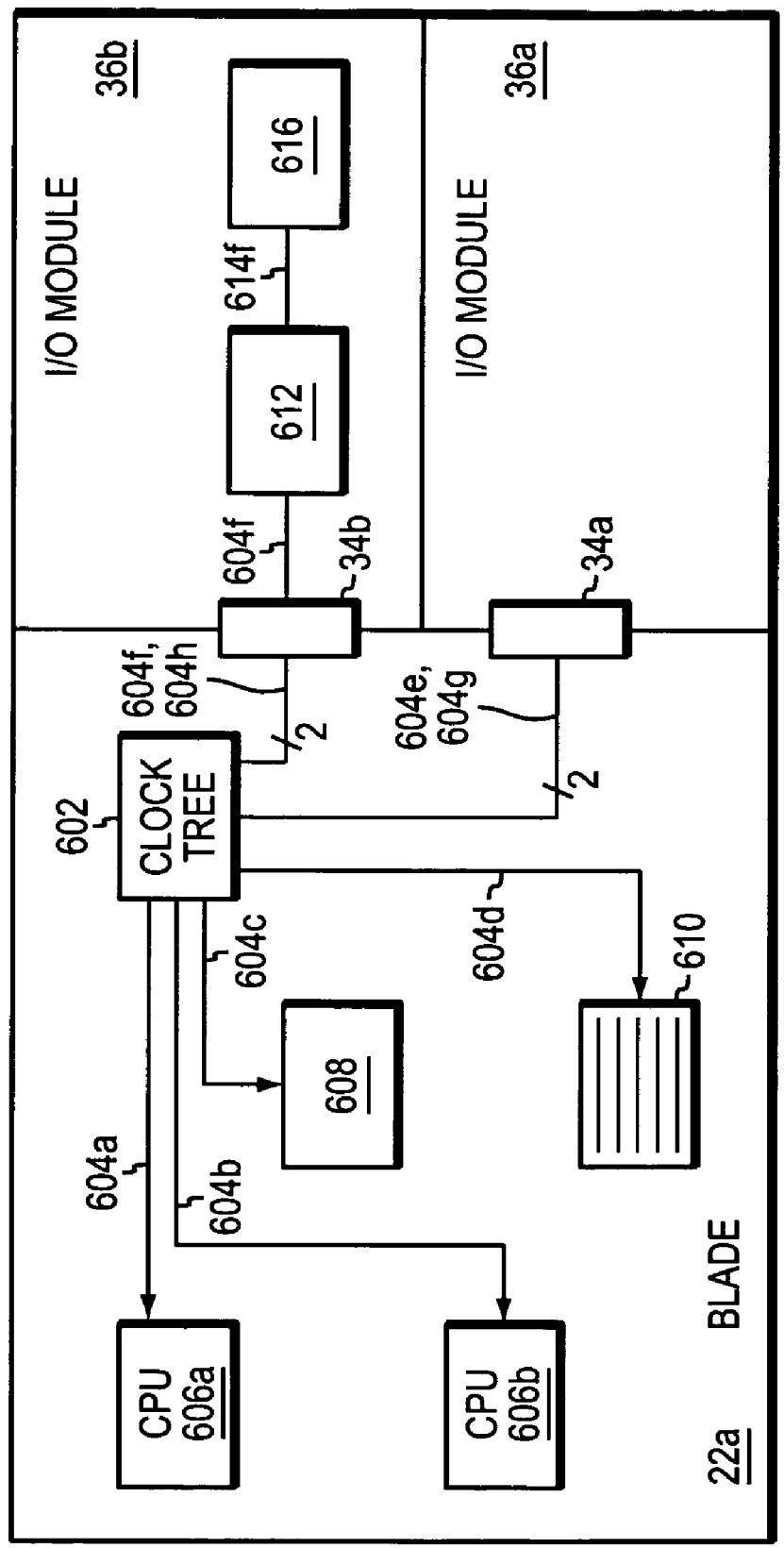
FIG. 6 is a block diagram of portions of a version of the system of FIG. 3.

FIG. 6 illustrates an implementation in which at least one of the blades 22a, 22b (here exemplified by blade 22a) has clock tree functionality 602 that provides respective clock signals 604a-604d to CPU functionality 606a, 606b, architecture chipset 608 (e.g., Intel Northbridge), DIMM memory 610, and that provides PCI Express clock signals 604e, 604g, 604f, 604h to I/O modules 36a, 36b respectively via connectors 34a, 34b respectively (each I/O module receives two PCI Express clocks, and one or both may be used, depending on the implementation). The PCI express clock signals are readily available from a standard buffer described below that is part of a PCI Express chipset. At least one of the I/O modules 34a, 34b (here exemplified by I/O module 36b) has derivation functionality 612 (described below) to derive, from respective PCI Express clock signal 604f, a corresponding PECL clock signal 614f, which is used to drive PECL clock receiving functionality 616. Depending on the implementation, functionality 616 may be in or for a PCI Express Fibre Channel traffic controller that does not accept a PCI Express clock signal. In such a case, as noted above, without the derivation functionality, it would be necessary to provide a separate oscillator for a PECL clock signal for the controller.

Figure 7A:
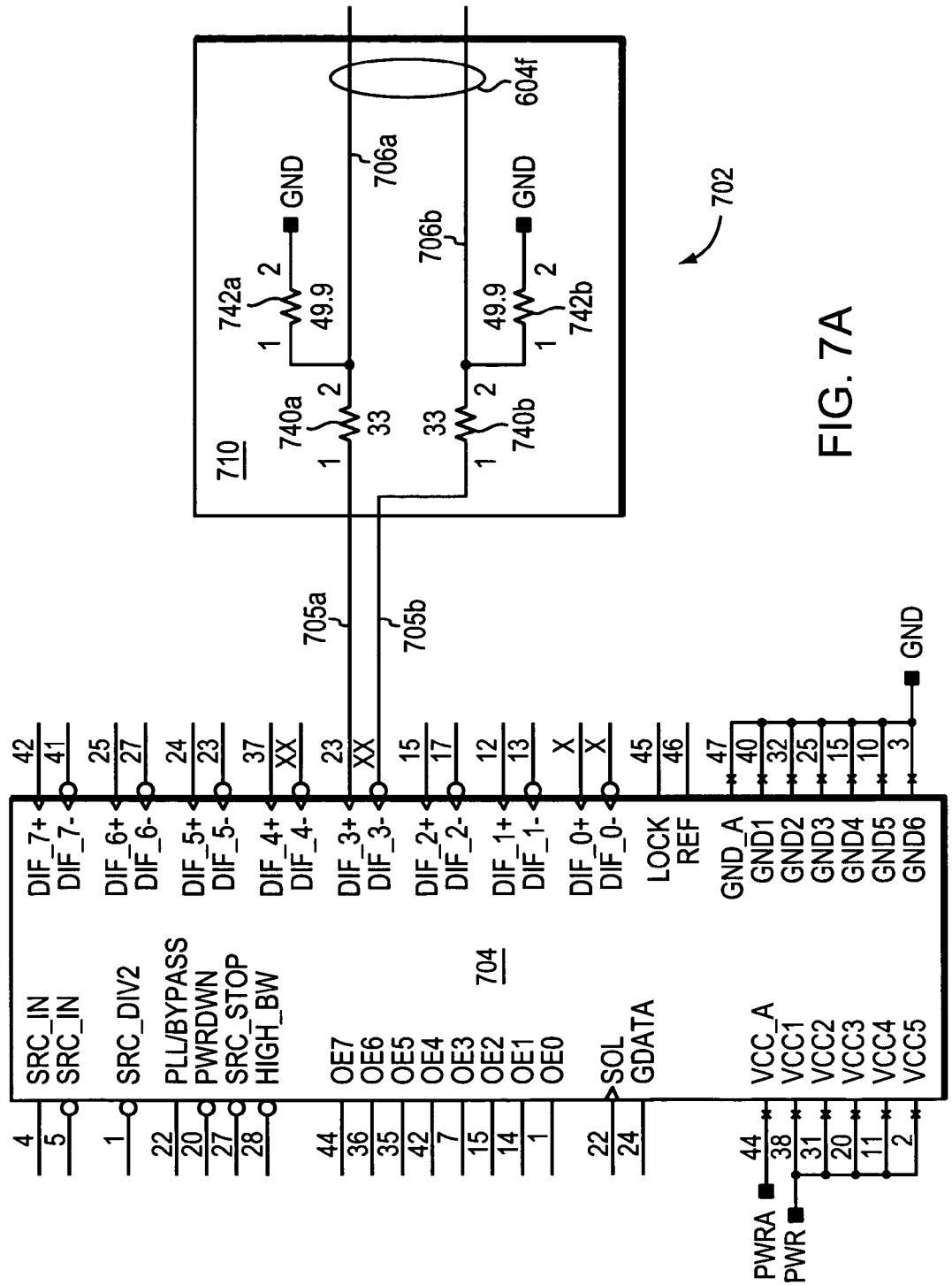
FIGS. 7A-7B are diagrams of circuitry included in the system of FIG. 6.
Figure 7B:
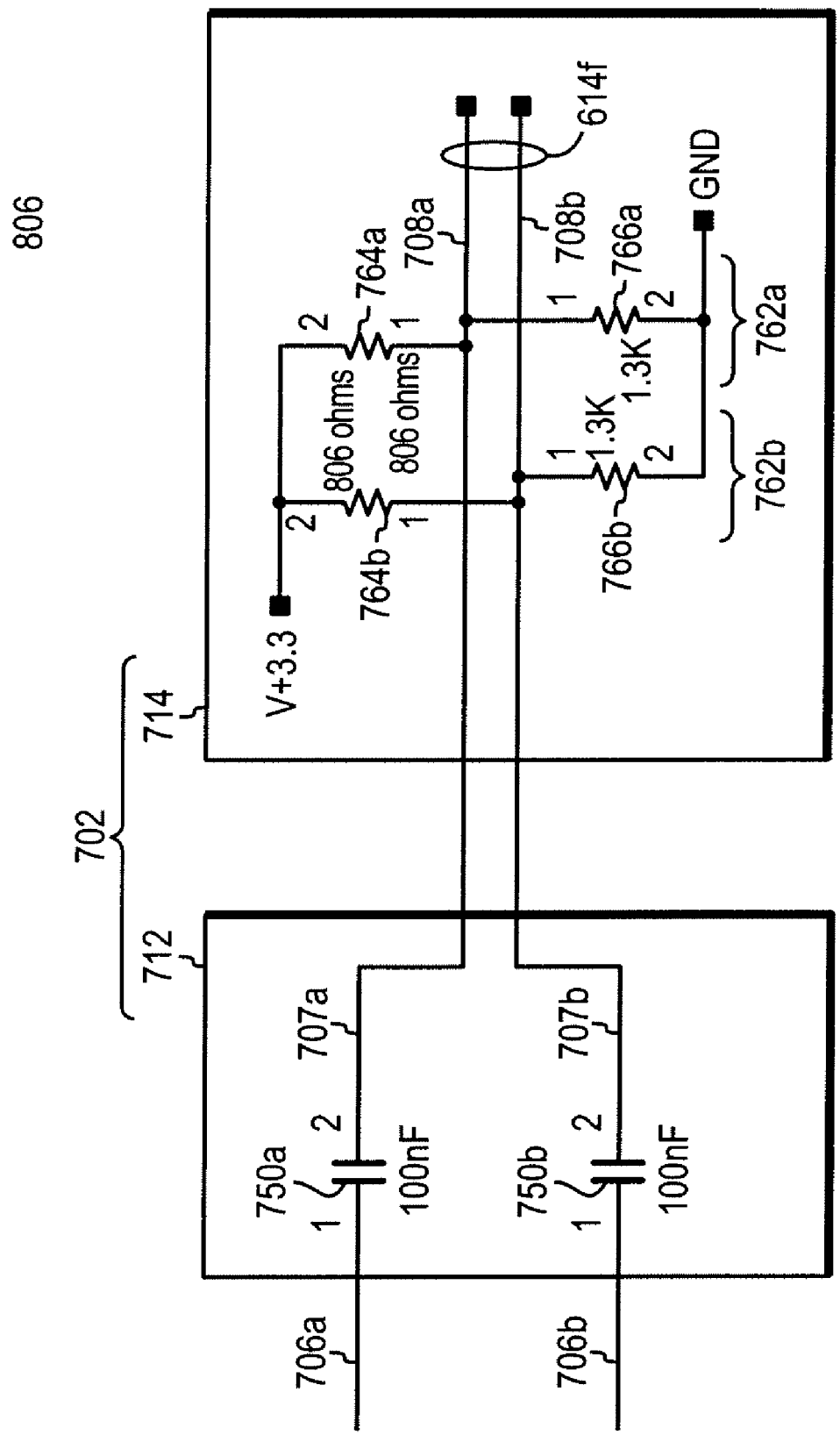

FIGS. 7A-7B illustrates a detailed example 702 of derivation functionality 612 with related sample circuitry. Clock tree functionality 602 includes clock buffer 704 and source proximate circuitry 710. Buffer 704 produces complementary source PCI Express base signals 705a, 705b from which source proximate circuitry 710 derives PCI Express clock signal 604f which includes complementary signals 706a, 706b.

Buffer 704 may be or include a CY28401 PCI Express clock buffer product available from Cypress Semiconductor Corporation. Base signals 705a, 705b are produced by clock output buffers that are current mode drivers. These are open drain devices that contain no active pull-down devices. They rely on external termination circuitry, which references a lower supply voltage VSS to pull signals 705a, 705b to a low logic level. When driving high, the output driver obtains current from higher supply voltage VDD pins of buffer 704. Target impedance for signals 705a, 705b is 100 ohms, measured differentially.

Signals 705a, 705b operate using a current steering signaling level technique. The output driver sources a constant current, switching alternately between the true and complementary outputs of the clock pair. While buffer 704 pulls one output high, the external termination circuitry pulls the other output low.

Source proximate circuitry 710 is disposed near buffer 704 and performs source termination on base signals 705a, 705b so that complementary signals 706a, 706b are source terminated. For signal 705a, resistor 740a (33 ohms) and resistor 742a (49.9 ohms) form a resistor bridge to ground so that signal 705a is source terminated. For signal 705b, resistor 740b (33 ohms) and resistor 742b (49.9 ohms) form a resistor bridge to ground so that signal 705b is source terminated.

In particular, source proximate circuitry 710 implements a termination scheme that uses a shunt source terminated topology. Series termination resistors 740a, 740b increase the source impedance of the output drivers. Resistors 742a, 742b represent shunt resistors to ground, which serve two purposes. The first is that by interacting with resistors 740a, 740b they control the maximum voltage level that is developed between differential transmission line traces. Secondly, they provide an appropriate lumped termination load to absorb and dissipate the reflected wave front that returns on the transmission line from the far end load end.

FIG. 7B illustrates derivation functionality 702 that derives, from signals 706a, 706b, corresponding PECL clock signal 614f which includes complementary signals 708a, 708b.

Derivation functionality 702 includes direct current (DC) blocking circuitry 712 and destination proximate circuitry 714. DC blocking circuitry 712 includes series capacitor 750a (100 nF) to produce, from signal 706a, an AC coupled signal 707a, and includes series capacitor 750b (100 nF) to produce, from signal 706b, an AC coupled signal 707b.

Destination proximate circuitry 714 is disposed near PECL clock receiving functionality 616 (destination) and derives, from signals 707a, 707b, PECL clock signal 614f which includes complementary signals 708a, 708b. Circuitry 714 includes a resistor bridge 762a for setting an input DC bias for signal 707a, and includes a resistor bridge 762b for setting an input DC bias for signal 707b. For a PECL input termination the resistors of each bridge should have values that set the input DC bias to VCC-1.3V. Here, since VCC is 3.3V, the input DC bias is set to 2.0V. Thus, in bridge 762a, the ratio of the value of resistor 766a to the sum of the values of resistors 764a and 766a should be 2.0/3.3, or 0.61. This is accomplished if the value of resistor 764a is set to 806 ohms and the value of resistor 766a is set to 1.3 kohms. The same goes for bridge 762b in which the value of resistor 764b is set to 806 ohms and the value of resistor 766b is set to 1.3 kohms.

Conventionally, a PECL link is terminated at the destination, e.g., with a 50 ohm termination. Here, that would have been accomplished, for example, by setting the value of resistor 764a to 80 ohms and the value of resistor 766a to 130 ohms (50 ohms being provided by 80 ohms in parallel with 130 ohms). However, since source proximate circuitry 710 already includes source termination of 49.9 ohms, providing a destination termination of 50 ohms would result in an overall termination of about 25 ohms and an amplitude loss of about 50%. The 806 ohm and 1.3 kohm values described above (a tenfold increase) provide a destination termination of about 500 ohms. Thus the source termination of 49.9 ohms and the destination termination of about 500 ohms provide an overall termination of about 50 ohms.

As described, derivation functionality 702 uses only passive components and requires no amplifiers, buffering, or re-clocking to derive, from a PCI Express clock signal, a corresponding PECL clock signal.

The corresponding PCI Express and PECL clock signals are synchronous, so that a first component driven by the PCI Express clock signal can communicate or execute synchronously with a second component driven by the corresponding PECL clock signal.

The present invention is not to be limited in scope by the specific embodiments described herein. Indeed, various modifications of the present invention, in addition to those described herein, will be apparent to those of ordinary skill in the art from the foregoing description and accompanying drawings. Thus, such modifications are intended to fall within the scope of the invention. Further, although aspects of the present invention have been described herein in the context of a particular implementation in a particular environment for a particular purpose, those of ordinary skill in the art will recognize that its usefulness is not limited thereto and that the present invention can be beneficially implemented in any number of environments for any number of purposes. For example, one or more of the techniques described above may be used in deriving multiple corresponding signals from a single original signal. A variation (e.g., with different resistor values) may be used in a system having a power supply with a voltage different from the 3.3V supply described above. Different component values (e.g., different capacitance values) may be used in a system in which the original signal has a significantly higher or lower frequency. Additional components may be added, e.g., to handle longer or shorter signal lines or lesser or greater loads on the signals. All or one or more portions of different embodiments may be implemented using PC board level circuit construction or integrated circuit level circuit construction.

I claim:

1. Apparatus for use in deriving corresponding signals, comprising:
   first circuitry deriving, from a source-terminated first signal driven from a Peripheral Control Interface (PCI) Express compatible source, an AC-coupled second signal;
   second circuitry deriving, from the AC-coupled second signal, a destination-terminated DC biased third signal that drives a pseudo-emitter-coupled logic (PECL) compatible receiver; and
   source proximate circuitry deriving the source-terminated first signal from an unterminated signal from a clock buffer having output buffers that are current mode drivers being open drain devices that contain no active pull-down devices.

2. The apparatus of claim 1, further comprising:
   source proximate circuitry deriving the source-terminated first signal from an unterminated signal from the PCI Express compatible source.

3. The apparatus of claim 1, wherein the second circuitry is proximate the PECL compatible receiver.

4. The apparatus of claim 1, further comprising:
   source proximate circuitry having a resistor bridge to ground.

5. The apparatus of claim 1, further comprising:
   source proximate circuitry implementing a termination scheme that uses a shunt source terminated topology.

6. The apparatus of claim 1, wherein the first circuitry comprises:
   DC blocking circuitry including a series capacitor.

7. The apparatus of claim 1, wherein the second circuitry comprises:
   a resistor bridge for setting an input DC bias for the AC-coupled second signal.

8. The apparatus of claim 1, wherein the second circuitry comprises:
   a resistor bridge providing destination termination greater than 50 ohms.

9. Apparatus for use in deriving corresponding signals, comprising:
   first circuitry deriving, from a source-terminated first signal driven from a Peripheral Control Interface (PCI) Express compatible source, an AC-coupled second signal; and
   second circuitry deriving, from the AC-coupled second signal, a destination-terminated DC biased third signal that drives a pseudo-emitter-coupled logic (PECL) compatible receiver,
   wherein the second circuitry comprises:
   a resistor bridge having first and second resistors, the bridge having a ratio of the value of the first resistor to the sum of the values of the first resistor and the second resistor being 0.61.

10. Apparatus for use in deriving corresponding signals, comprising:
    a blade coupled to an expansion slot, the blade having first circuitry deriving, from a source-terminated first signal driven from a Peripheral Control Interface (PCI) Express compatible source, an AC-coupled second signal; and
    a first module coupled to the blade via the expansion slot, the first module having second circuitry deriving, from the AC-coupled second signal, a destination-terminated DC biased third signal that drives a pseudo-emitter-coupled logic (PECL) compatible receiver, wherein the first module optionally includes a separate PECL oscillator.

11. The apparatus of claim 10, further comprising:
    clock tree functionality providing the first signal.

12. Apparatus for use in deriving corresponding signals, comprising:
    a blade coupled to an expansion slot, the blade having first circuitry deriving, from a source-terminated first signal driven from a Peripheral Control Interface (PCI) Express compatible source, an AC-coupled second signal;
    a first module coupled to the blade via the expansion slot, the first module having second circuitry deriving, from the AC-coupled second signal, a destination-terminated DC biased third signal that drives a pseudo-emitter-coupled logic (PECL) compatible receiver; and
    connectors delivering two PCI Express clocks to the first module.

* * * * *